United States Patent
Kaminaga et al.

(10) Patent No.: US 6,321,734 B1
(45) Date of Patent: Nov. 27, 2001

(54) RESIN SEALED ELECTRONIC DEVICE AND METHOD OF FABRICATING THE SAME AND IGNITION COIL FOR INTERNAL COMBUSTION ENGINE USING THE SAME

(75) Inventors: Toshiaki Kaminaga, Naka-machi; Masami Shida; Noboru Sugiura, both of Mito; Ryoichi Kobayashi, Tokai-mura; Katsuaki Fukatsu, Urizura-machi, all of (JP)

(73) Assignees: Hitachi, Ltd., Tokyo; Hitachi Car Engineering Co., Ltd., Hitachinaka, both of (JP)

( * ) Notice: Subject to any disclaimer, the term of this patent is extended or adjusted under 35 U.S.C. 154(b) by 0 days.

(21) Appl. No.: 09/544,555

(22) Filed: Apr. 6, 2000

(30) Foreign Application Priority Data

Apr. 6, 1999 (JP) .................................. 11-099088

(51) Int. Cl.$^7$ .................................................. H01L 23/29
(52) U.S. Cl. .......................... 123/634; 123/647; 257/795; 257/787; 257/789; 438/127
(58) Field of Search ..................... 123/634, 647; 257/787, 789, 795, 778; 438/108, 126, 127

(56) References Cited

U.S. PATENT DOCUMENTS

| | | | |
|---|---|---|---|
| 3,737,986 | * | 6/1973 | Cranston ........................ 29/589 |
| 5,508,611 | * | 4/1996 | Schroeder et al. ................ 324/252 |
| 5,785,624 | * | 6/1998 | Satou et al. ..................... 123/634 |
| 5,977,856 | * | 11/1999 | Maekawa et al. ................. 123/634 |
| 6,005,464 | * | 12/1999 | Sakamaki et al. ................ 123/634 |
| 6,083,774 | * | 7/2000 | Shiobara et al. ................. 438/108 |
| 6,085,859 | * | 7/2000 | Beukes et al. ................... 102/206 |
| 6,111,378 | * | 8/2000 | Le May et al. ................... 318/443 |
| 6,181,002 | * | 1/2001 | Juso et al. ...................... 257/778 |
| 6,198,357 | * | 3/2001 | O'toole et al. ................... 331/57 |
| 6,225,703 | * | 5/2001 | Umehara et al. ................. 257/787 |

FOREIGN PATENT DOCUMENTS

| | | |
|---|---|---|
| 09-246300 | 9/1997 | (JP) . |
| 10-107182 | 4/1998 | (JP) . |

* cited by examiner

Primary Examiner—Erick Solis
(74) Attorney, Agent, or Firm—Crowell & Moring LLP

(57) ABSTRACT

In order to provide a resin sealed electronic device which is capable of securing high reliability by packaging with a transfer molding resin without using any under filler material, a resin sealed electronic device mounts a flip chip type monolithic IC on a hybrid circuit board through bumps and is packaged with a thermosetting resin through transfer molding. The transfer molding resin has a linear expansion coefficient of $3 \times 10^{-6}$ to $17 \times 10^{-6}$ and contains a filler having a particle size smaller than a height of the bump by more than 10 $\mu$m. The resin sealed electronic device is integrated in a unit including the hybrid circuit board mounting the flip chip type monolithic IC through transfer molding with the transfer molding resin, and the bump is restrained from moving by the transfer molding resin flowing around at transfer-molding.

16 Claims, 11 Drawing Sheets

PRIMARY CURRENT $I_1$

SECONDARY VOLTAGE $V_2$

31 COILS

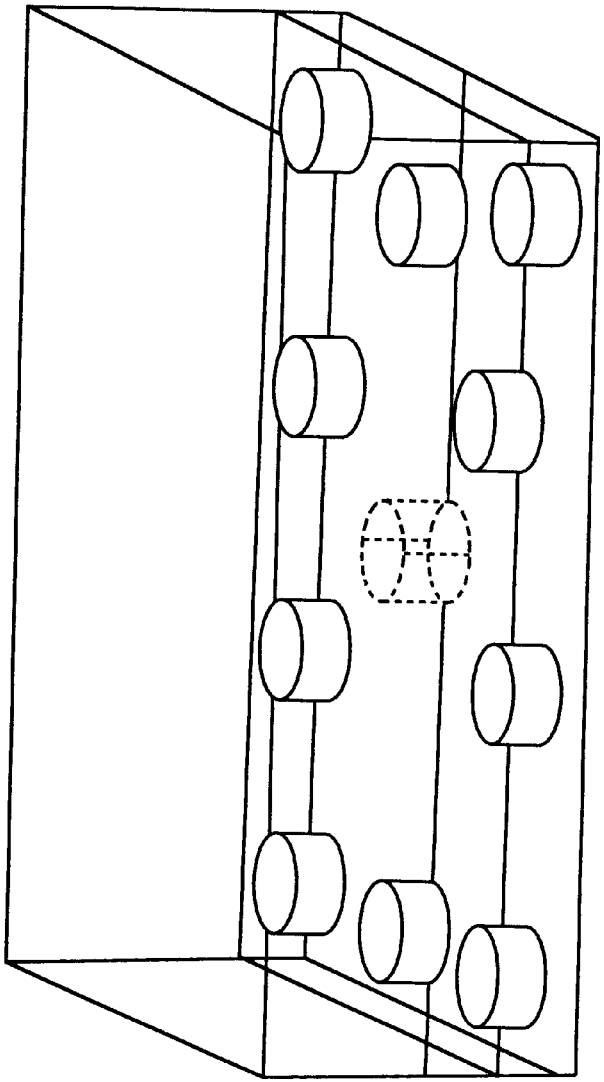

RESIN SEALED ELECTRONIC DEVICE AND METHOD OF FABRICATING THE SAME AND IGNITION COIL FOR INTERNAL COMBUSTION ENGINE USING THE SAME

This application claims priority of JP 11-99088, filed Apr. 6, 1999, the disclosure of which is expressly incorporated by reference herein.

BACKGROUND OF THE INVENTION

The present invention relates to a resin sealed semiconductor device, that is, a resin sealed electronic device and a method of fabricating the resin sealed electronic device and an ignition coil device for an internal combustion engine using the above resin sealed electronic device.

Various proposals to improve reliability of the resin sealed electronic devices have been made by reducing strains produced in the sealing resin in order to suppress occurrence of cracks.

Japanese Patent Application Laid-Open No.10-107182 discloses a resin sealed semiconductor device. The resin sealed semiconductor device in which electrodes formed on a board are electrically connected to a semiconductor chip through bumps, and a gap between the board and the semiconductor chip is filled with a sealing resin and the surrounding of the semiconductor chip is covered with the sealing resin, wherein when a height of the peripheral portion of the sealing resin covering the surrounding of the semiconductor chip from bottom end surface of the semiconductor chip is (b) and a distance between the outer peripheral edge of the peripheral portion and the bottom edge of the semiconductor chip in a plane being flush with the bottom end surface of the semiconductor chip is (a), an average value of (a/b) is smaller than 2; and the sealing resin is a resin material of an epoxy group composed of an epoxy resin and spherical particles made of a low thermal expansion inorganic material having a thermal expansion coefficient lower than that of the epoxy resin; and the sealing resin contains the inorganic material within the range of 50 to 80 weight % to the total weight.

Further, Japanese Patent Application Laid-Open No.9-246300 discloses a method of fabricating a semiconductor device. The method of fabricating a semiconductor device is one in which a chip is arranged on a board opposite to each other with a gap between them, and the gap between the chips and the board is filled with a lower layer side sealing resin, and the whole chip is covered with a upper layer side sealing resin, wherein the method of fabricating the semiconductor device comprises the first process of injecting a thermosetting resin before setting into the gap between the chip and the board; the second process of making the resin bring in a semi-set condition; the third process of disposing a thermosetting resin before setting so as to cover the whole chip; and the fourth process of completely setting the both laminated resins.

In the case where a flip chip is contained inside a conventional resin sealed electric device as described in Japanese Patent Application Laid-Open No.10-107182, an under filler material is initially injected and filled under the flip chip and then the under filler material is set, and after that the circuit board portion including the flip chip is sealed with a resin through transfer molding. Therefore, before sealing the whole circuit with the resin, there is the process of injecting, filling and setting of the under filler material. Most of liquid under filler materials have linear expansion coefficients near that of the solder in order to secure the reliability of the soldered portions, and such liquid under filler materials need to be stored at a low temperature and are heated up to room temperature when they are used. However, the pot-life of the liquid under filler material is short, and accordingly management of the liquid under filler material is troublesome because it needs to be run out within the pot-life period. Further, particularly, in a case where the size of flip chip is small and the bump height is low, it takes a very long time to inject and fill the under filler material, and to inject and fill the under filler material into the under portion of the bumps and to set the under filler material.

On the other hand, since the reliability of the electronic device may be deteriorated when the transfer molding resin is not bonded to the under filler material, control of setting the resin must be performed in order to improve bonding by making the under filler material bring in a semi-setting condition as described in Japanese Patent Application Laid-Open No.9-246300.

SUMMARY OF THE INVENTION

An object of the present invention is to provide a resin sealed electronic device in which packaging of a hybrid circuit board mounting a flip chip capable of securing high reliability by a transfer molding resin without using any under filler material used in the conventional technology described above, and to provide a method of fabricating the resin sealed electronic device.

In detail, principal aims of the present invention are to solve the conventional problem that the contact between the transfer molding resin and the under filling material is poor, the problem on the process that needs injecting and filling the under filling material, and the problem that cracks occur in the sealing resin by thermal stress due to use of the under filler material.

The resin used for transfer molding can be let to flow below the flip chip by setting the linear expansion coefficient of the transfer molding resin to $3 \times 10^{-6}$ to $17 \times 10^{-6}$ and using a filler to be added to the resin which is selected so that the particle size of the filler becomes smaller than a value of a bump height after mounting the flip chip on the board minus 10 $\mu$m. In this case, the difference between a thickness of the transfer molding resin in the periphery of the flip chip and a gap (clearance) formed by the bump height under the flip chip is large, and at molding the transfer molding resin initially covers the whole body of the flip chip and then is impregnated into the bump portion. Therefore, a void is formed at a position near the central portion under the flip chip. However, the outer peripheral portion forming the bumps of the flip chip where the thermal stress value becomes high can be restrained from moving by the transfer molding resin, and by using the resin having the set linear expansion coefficient and the set filler particle size the thermal stress exerting on the bump portion can be reduced to a value smaller than that in the case where the under filler material having the linear expansion coefficient of 20 to $30 \times 10^{-6}$. That is, the durable life-time can be improved.

The present invention provides a resin sealed electronic device which mounts a flip chip type monolithic IC on a hybrid circuit board through bumps, and is packaged with a thermosetting resin through transfer molding, wherein the thermosetting resin used for the transfer molding (hereinafter, referred to as "transfer molding resin") has a linear expansion coefficient of $3 \times 10^{-6}$ to $17 \times 10^{-6}$ and contains a filler having a particle size smaller than a height of the bump by more than 10 $\mu$m, and the resin sealed electronic device is integrated in a unit including the hybrid circuit board mounting the flip chip type monolithic IC through transfer molding with the transfer molding resin.

The present invention further provides a resin sealed electronic device in which the size of the filler is smaller than 75 µm.

The present invention provides a resin sealed electronic device which mounts a flip chip type monolithic IC on a hybrid circuit board through bumps, and is packaged with a transfer molding resin, wherein the resin sealed electronic device is integrated in a unit including the hybrid circuit board mounting the flip chip type monolithic IC through transfer molding with the transfer molding resin, and the bump is restrained from moving by the transfer molding resin flowing around at transfer-molding.

The present invention provides a resin sealed electronic device which mounts a flip chip type monolithic IC on a hybrid circuit board through bumps, and is packaged with a transfer molding resin, wherein the resin sealed electronic device is integrated in a unit including the hybrid circuit board mounting the flip chip type monolithic IC through transfer molding with the transfer molding resin, and a gap between the flip chip type monolithic IC and the hybrid circuit board is filled with the transfer molding resin flown around at transfer molding excluding voids or including voids.

The present invention further provides a resin sealed electronic device in which the bump described above is soldered to a conductor wire on the hybrid circuit board, and surfaces of the bump except for a surface to be soldered are coated, and the transfer molding resin is thermally set on the coated surfaces.

The present invention further provides a resin sealed electronic device in which an epoxy resin is used for the transfer molding resin.

The present invention provides a method of fabricating a resin sealed electronic device which mounts a flip chip type monolithic IC on a hybrid circuit board through bumps, and is packaged with a transfer molding resin, wherein the method comprises the steps of performing molding using the transfer molding resin having a linear expansion coefficient of $3 \times 10^{-6}$ to $17 \times 10^{-6}$ and containing a filler having a particle size smaller than a height of the bump by more than 10 µm; and exerting a transfer molding pressure at the molding so that the transfer molding resin flows around between the flip chip type monolithic IC and the hybrid circuit board.

The present invention further provides a method of fabricating a resin sealed electronic device, wherein an epoxy resin is used for the transfer molding resin, and the epoxy resin is octo-cresol novolak type epoxy resin, and a glass transition point temperature of the epoxy resin is higher than 150° C.

The present invention further provides a method of fabricating a resin sealed electronic device, wherein the epoxy resin contains silicone of 1 to 8%.

The present invention further provides a method of fabricating a resin sealed electronic device, wherein the filler is composed of cubic molten silica particles, spherical molten silica particles or a mixture of the molten silica particles.

The present invention further provides a resin sealed electronic device in which the hybrid circuit board is mounted on a lead frame of copper group; a power system semiconductor element being mounted at a position on the lead frame other than the board mounting portion using a solder or an electric conductive adhesive; a bonding pad portion provided on the circuit board being connected to a bonding pad portion of the semiconductor element by wire bonding; an external output terminal portion formed in the lead frame being connected to the circuit board similarly by wire bonding.

The present invention further provides a resin sealed electronic device in which a ceramic substrate of alumina group having a conductor of silver/platinum group or a conductor of copper group is used for the hybrid circuit board; and a high temperature solder of lead/tin group is used for the solder in the bump portion of the flip chip and the solder used for mounting discrete parts mounted on the board.

The present invention further provides a resin sealed electronic device in which a ceramic substrate of alumina group having a conductor of silver/platinum group or a conductor of copper group is used for the hybrid circuit board; and a high temperature solder of silver/tin group is used for the solder in the bump portion of the flip chip and similarly the solder used for mounting discrete parts mounted on the board.

The present invention further provides a resin sealed electronic device in which a high heat resistance glass-epoxy substrate having a linear expansion coefficient smaller than $17 \times 10^{-6}$ is used for the hybrid circuit board, and a high temperature solder of silver/tin group is used for the solder in the bump portion of the flip chip and similarly the solder used for mounting discrete parts mounted on the board.

The present invention further provides a resin sealed electronic device in which the solder of silver/tin group used contains silver of 1 to 5%.

The present invention provides an internal combustion engine ignition coil device comprising a resin sealed electronic device which mounts a flip chip type monolithic IC on a hybrid circuit board through bumps, and is packaged with a transfer molding resin, wherein the resin sealed electronic device comprises a flip chip type monolithic IC having a size smaller than 5 mm×5 mm; a molding body integrated in a unit including the hybrid circuit board mounting the flip chip type monolithic IC through transfer molding with the transfer molding resin; and a structure that the molding body is embedded into the coil main body with a molding resin having a thermal expansion coefficient larger than a thermal expansion coefficient of the transfer molding resin, and a transfer molding resin portion composing said molding body shows a continuous uniform stress diagram including the transfer molding resin portion between the flip chip type monolithic IC and the hybrid circuit board.

Further, by making the chip size of the flip chip smaller than 5 mm×5 mm, the effect of the thermal stress caused by the voids produced under the flip chip can be made negligible.

Further, by applying a coating material of polyimide or polyamide group on the portion of the circuit configuration surface of the flip chip other than the solder bump configuration portions, the bonding property between the circuit surface of the flip chip and the transfer molding resin can be improved, and accordingly the reliability can be further improved.

Further, a complex type power system electronic device can be easily constructed by mounting the hybrid circuit board on the lead frame of copper group; mounting the power system semiconductor element at a position on the lead frame other than the board mounting portion using the solder or the electric conductive adhesive; connecting the bonding pad portion provided on the circuit board to the bonding pad portion of the semiconductor element by wire bonding; connecting the external output terminal portion formed in the lead frame being connected to the circuit board similarly by wire bonding; forming the circuit using the flip chip type monolithic IC on the hybrid circuit board, the circuit being formed in a control circuit for performing control of conducting and breaking of current of the power element.

By using a ceramic of alumina group for the hybrid circuit board, the linear expansion coefficient of the hybrid circuit board can be set to a value near that of the sealing resin used, and accordingly the stress caused by the sealing resin can be reduced. By employing the combination of the conductor of silver/platinum group or copper group and the high temperature solder of tin/lead group for the conductor wiring materials formed on the ceramic substrate used, the high temperature durability can be secured and accordingly a long life-time can be attained. Further, in the case where the tin/silver group is used for the solder, lead-free wiring can be attained.

By using the high heat resistance glass-epoxy substrate having a linear expansion coefficient smaller than $17 \times 10^{-6}$ for the hybrid circuit board to reduce the stress produced in the substrate caused by the sealing resin, it is possible to reduce the cost of making the substrate of ceramic group. In this case, lead-free wiring can be attained by employing the high temperature solder of the silver/tin group.

Wettability of the solder can be secured by setting the content of silver in the of silver/tin group to 1 solder to 5%.

In a case of applying the present invention to an electronic device of power system, by employing a solder of tin/antimony group when the solder is used for mounting a power system semiconductor element, use of lead can be eliminated in the whole electronic device, and the reliability can be also secured because the solder of tin/antimony group is high in resistance against thermal cycle.

By employing a resin of epoxy group for the resin used for the transfer molding, it is possible to use the common and economical resin widely used in semiconductor packaging.

The high glass transition temperature can be secured by using, for the transfer molding resin, octo-cresol novolak type epoxy resin among the resins of epoxy group, and accordingly high reliability can be secured up to a junction temperature of 150° C., that is, the general guaranteed operation temperature by making the glass transition point temperature of the epoxy resin together with the contained filler higher than 150° C.

By using molten silica particles as the filler added to the resin, the semiconductor element and the hybrid circuit board can be prevented from being damaged by sharp edges in corners of the particles. Although there are cubic molten silica particles and spherical molten silica particles among the molten silica particles, the semiconductor element and the hybrid circuit board can be prevented from being damaged best when the cubic molten silica particles are solely used.

In a case of using epoxy sealing resin, by adding silicone oil to the epoxy resin, thermal stress exerting on the contained parts from the resin can be reduced and accordingly the reliability can be improved.

A high reliable electronic device can be fabricated by constructing a circuit for performing control of conducting and breaking primary current of an ignition coil for an internal combustion engine on the hybrid circuit board, using a bipolar transistor or an insulated gate type bipolar transistor for the power system semiconductor element, and forming into a resin sealed complex power system semiconductor device, in the resin sealed type electronic device constructed as described above. Then, by embedding the resin sealed complex power system semiconductor device into an ignition coil, a high reliable ignition device containing a resin sealed electronic device can be fabricated.

BRIEF DESCRIPTION OF THE DRAWINGS

SUMMARY OF THE INVENTION

Figure 1:
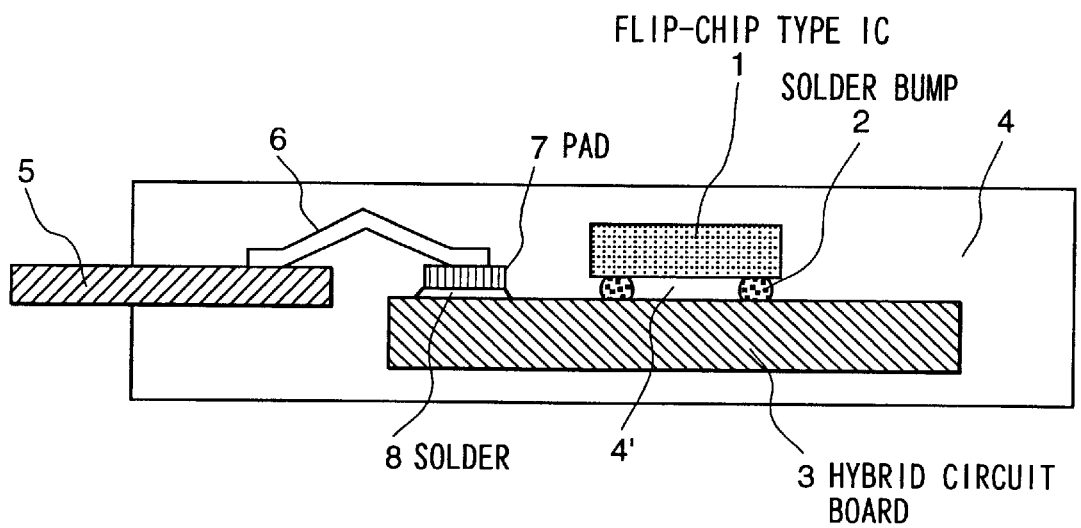

FIG. 1 is a vertical cross-sectional view showing the construction of an embodiment of a resin sealed electronic device in accordance with the present invention.

Figure 2:
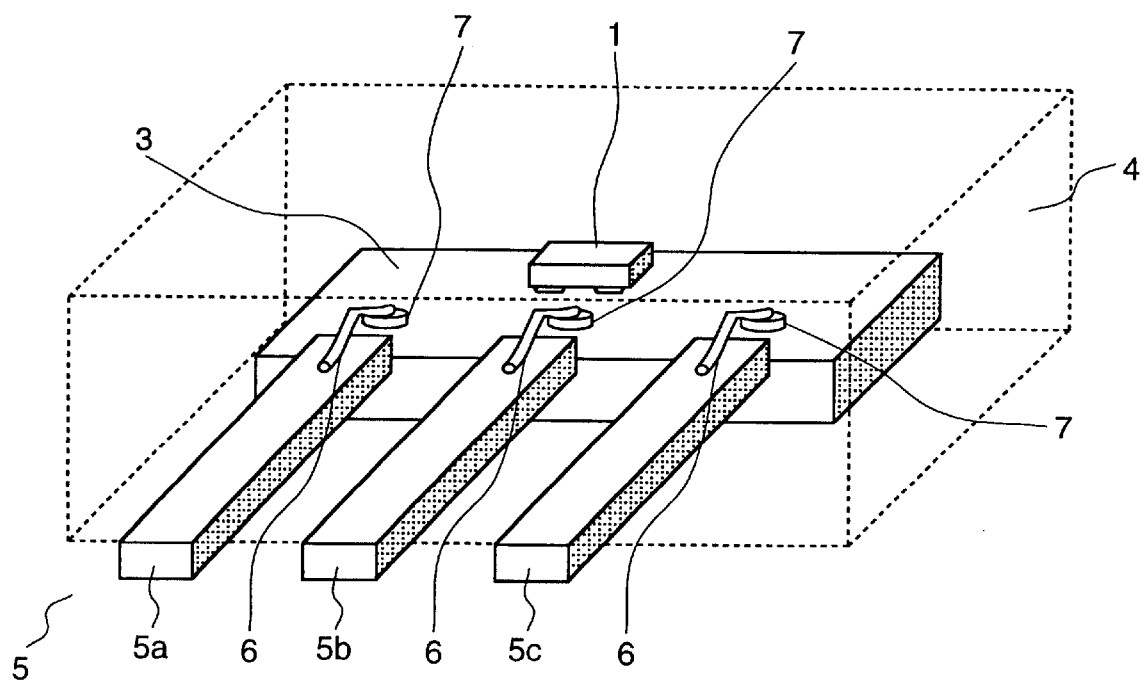

FIG. 2 is a perspective view showing the resin sealed electronic device of FIG. 1.

Figure 3:
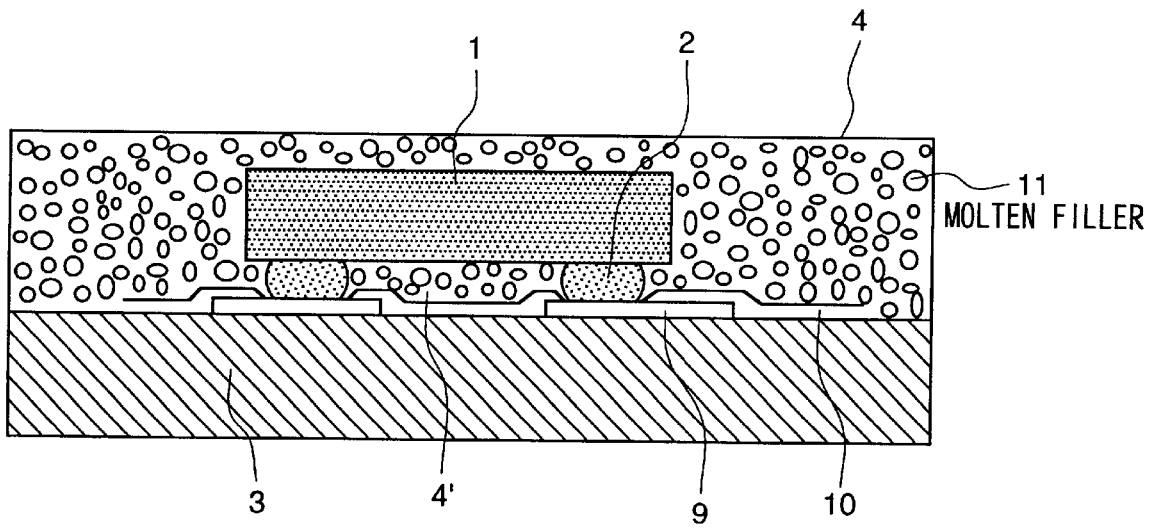

FIG. 3 is an enlarged detailed view showing the resin sealed electronic device of FIG. 1.

Figure 4:
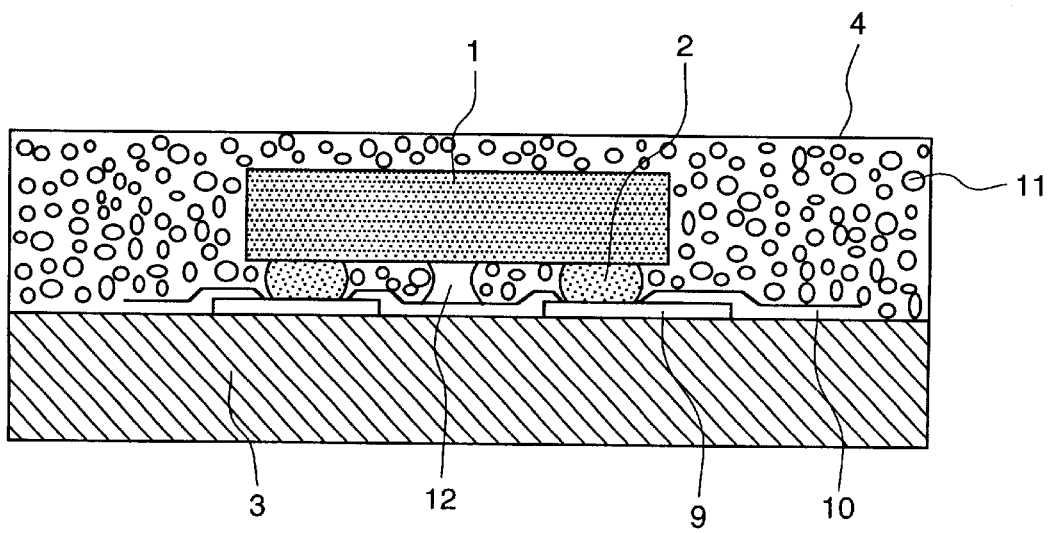

FIG. 4 is an enlarged detailed view showing another embodiment of a resin sealed electronic device in accordance with the present invention.

Figure 5:
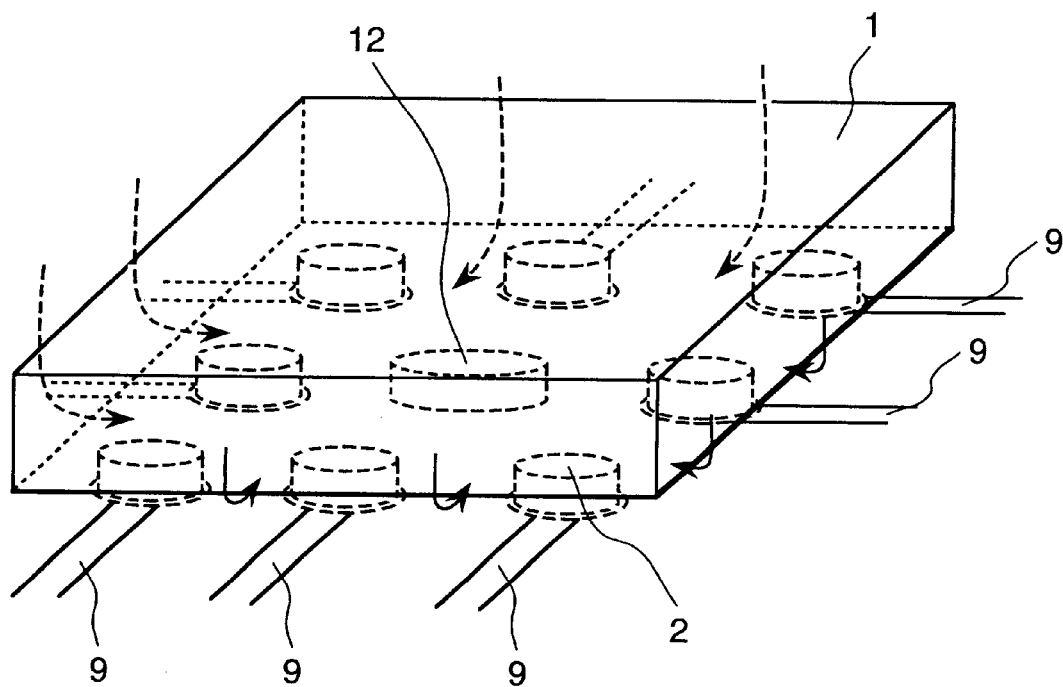

FIG. 5 is a perspective view showing the resin sealed electronic device of FIG. 4.

Figure 6:
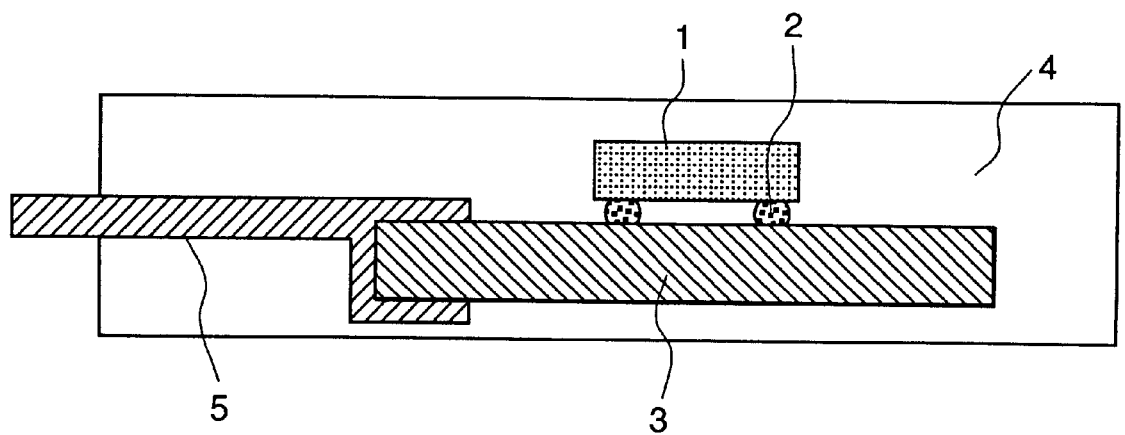

FIG. 6 is a vertical cross-sectional view showing the construction of a further embodiment of a resin sealed electronic device in accordance with the present invention.

Figure 7:
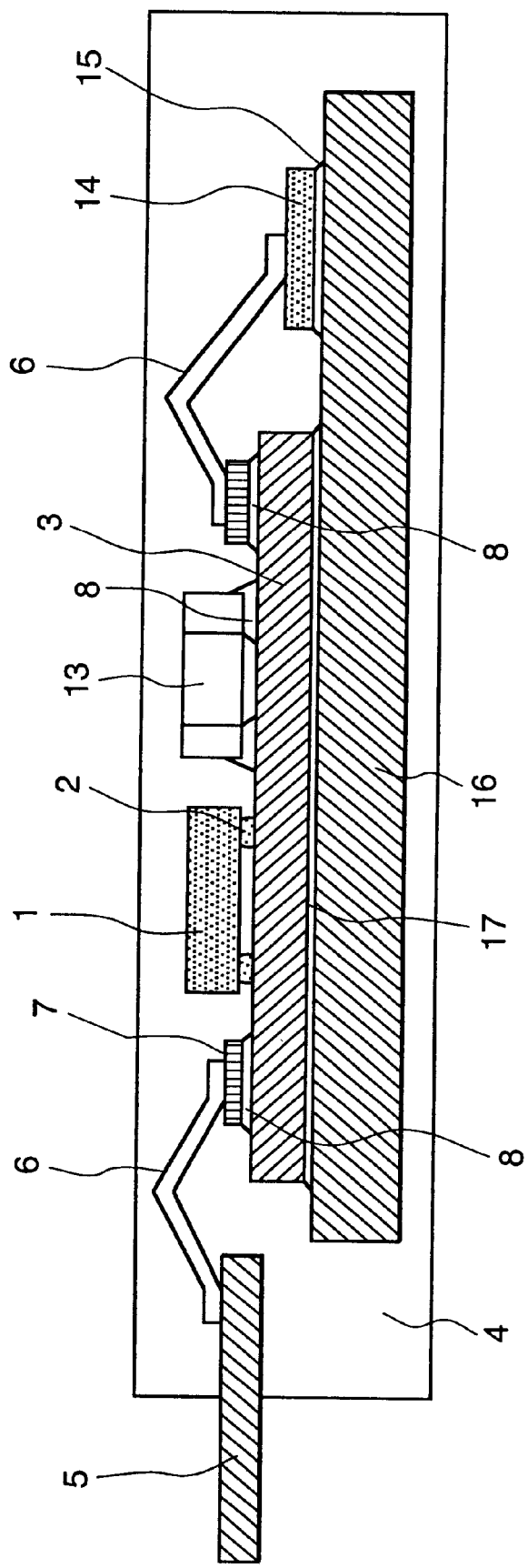

FIG. 7 is a vertical cross-sectional view showing the construction of a further embodiment of a complex power system resin sealed electronic device in accordance with the present invention.

Figure 8:
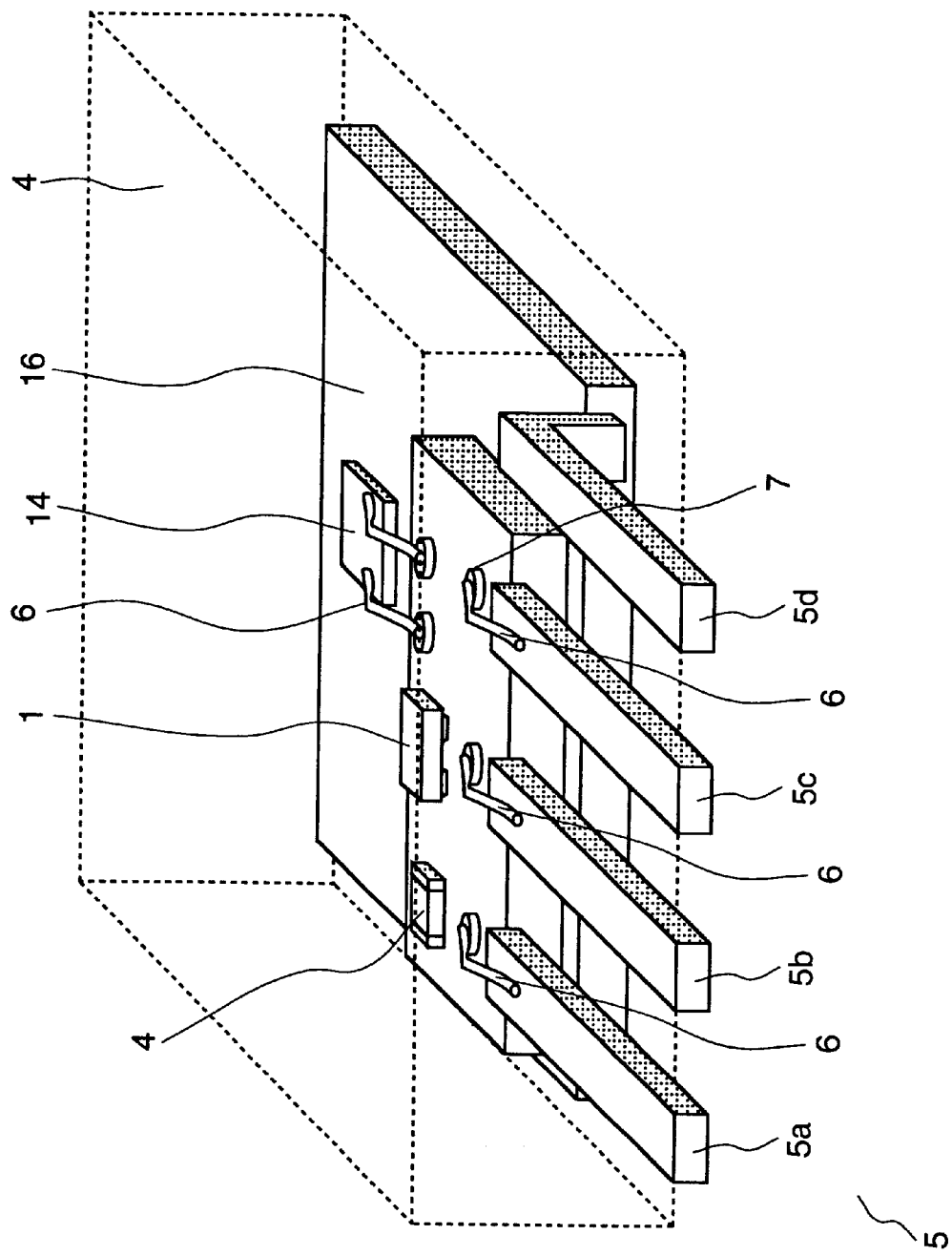

FIG. 8 is a perspective view showing the resin sealed electronic device of FIG. 7.

Figure 9:
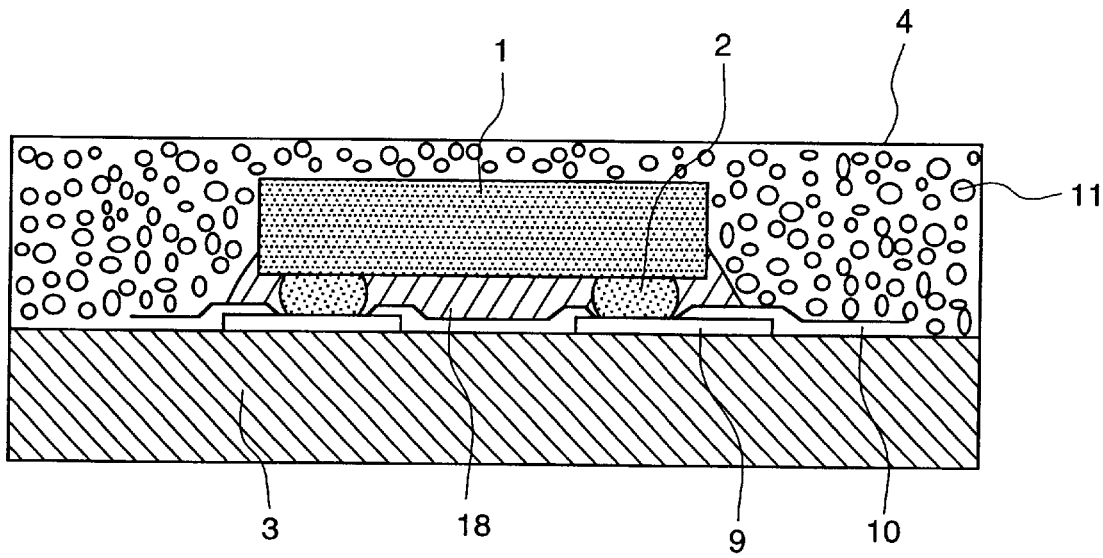

FIG. 9 is a vertical cross-sectional view showing the construction of an example of a conventional resin sealed electronic device.

Figure 10:
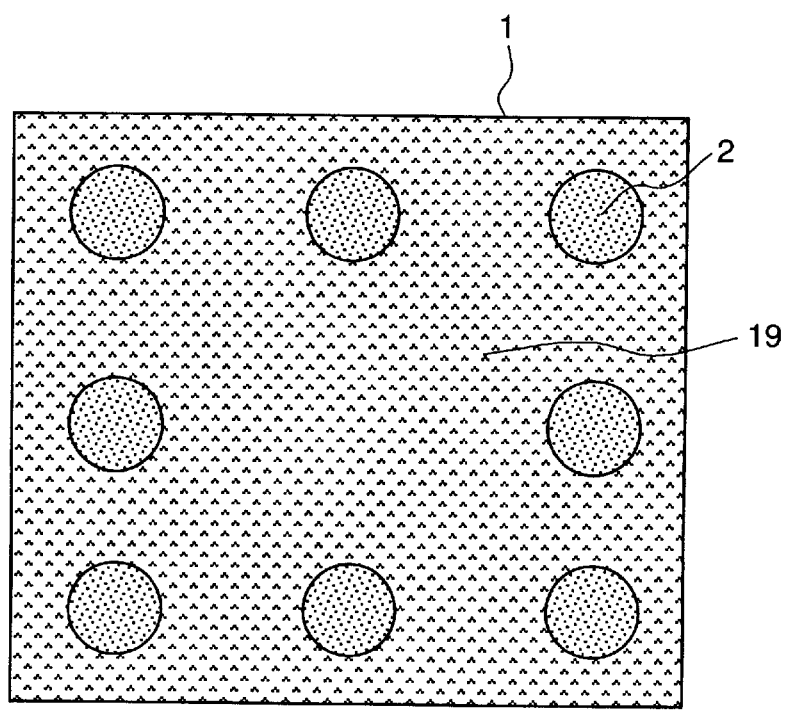

FIG. 10 is a view showing a flip chip seen from the bump side.

Figure 11:
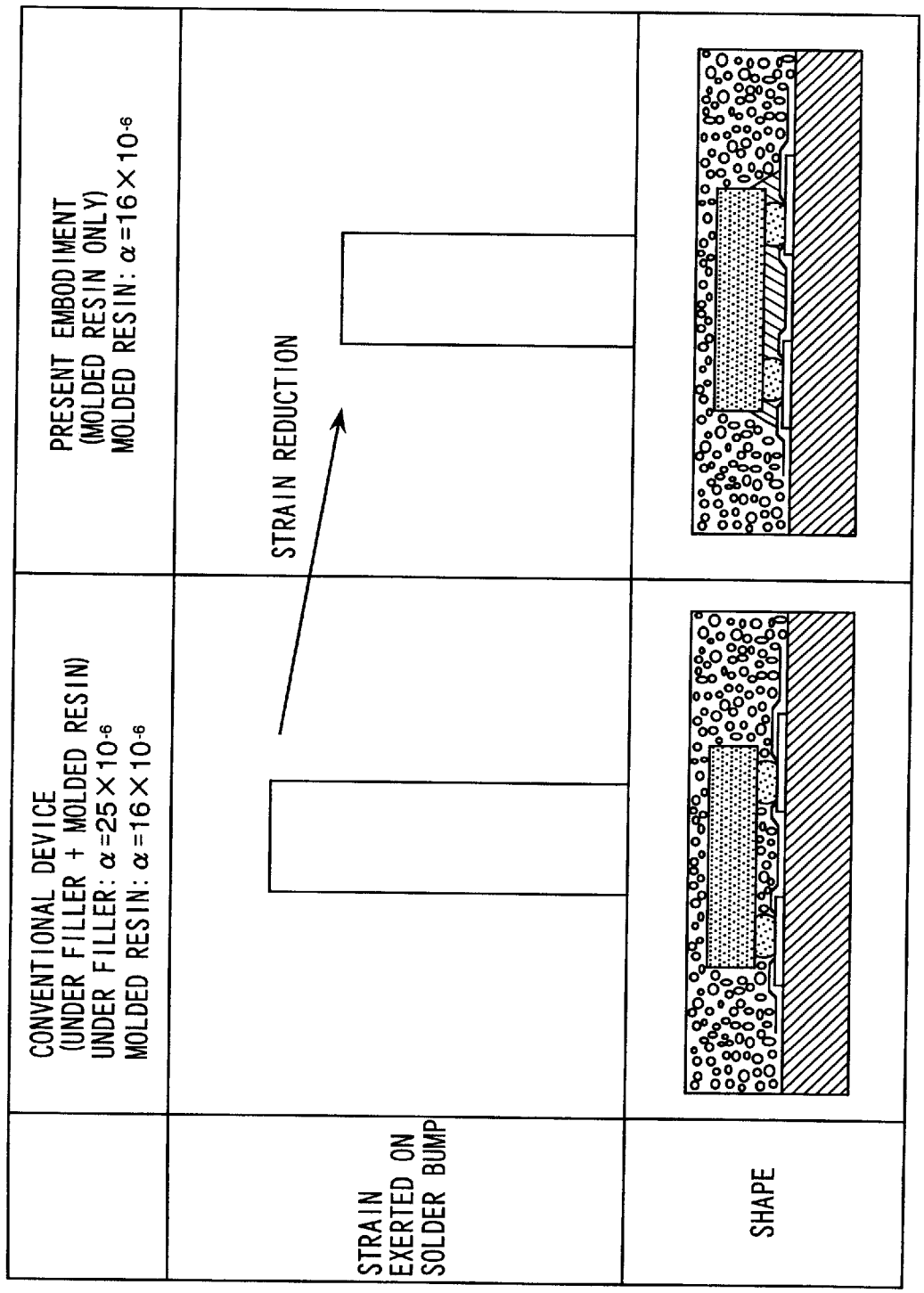

FIG. 11 is a chart showing an effect of the present embodiment.

Figure 12:
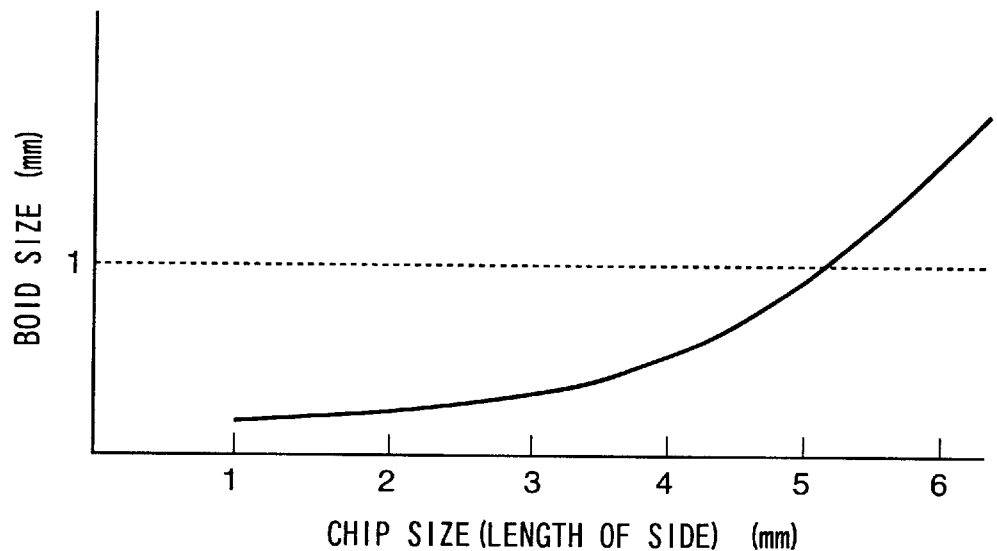

FIG. 12 is a graph of size of a produced void versus flip chip size.

Figure 13:
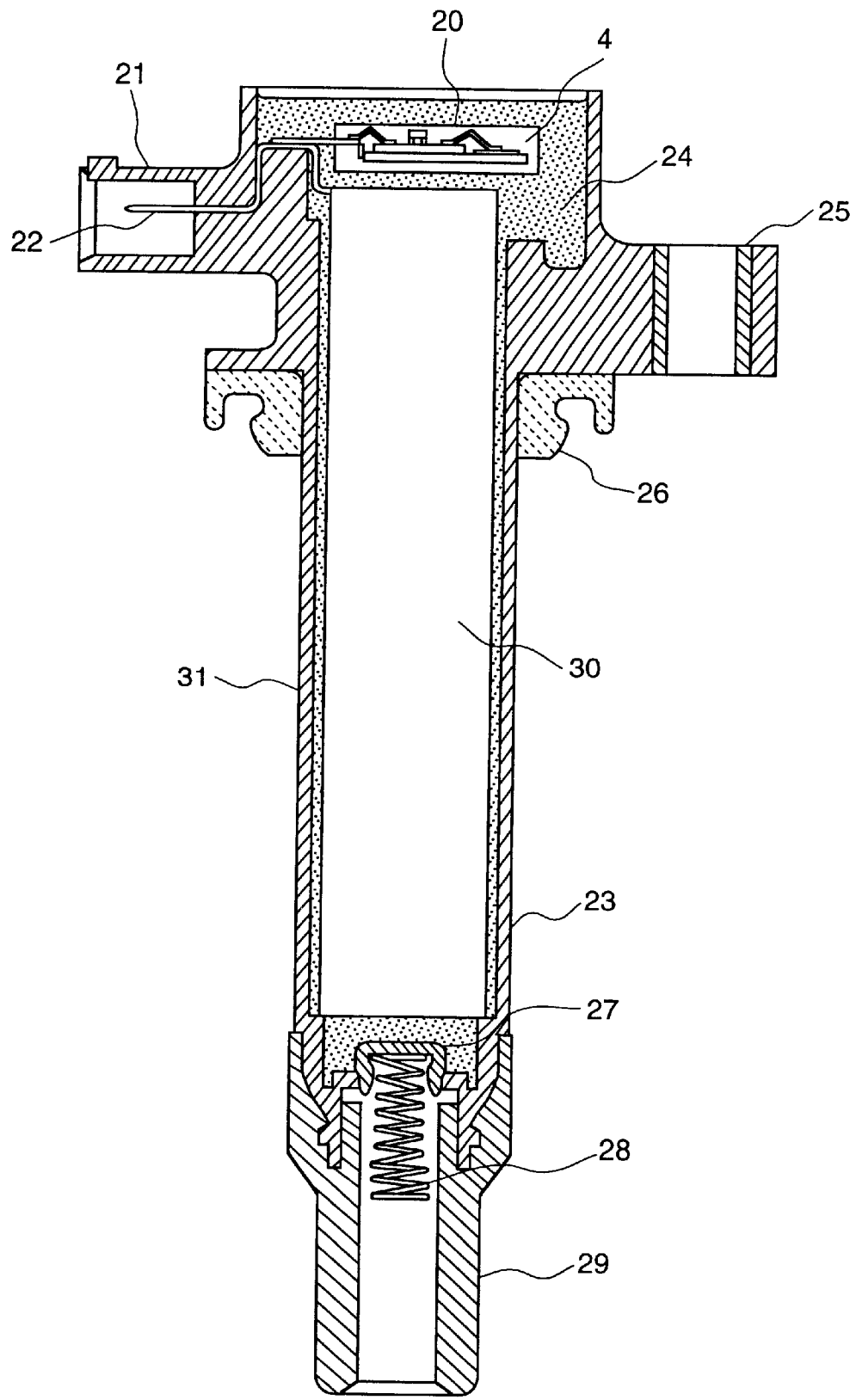

FIG. 13 is a cross-sectional view showing the construction of an application of an ignition coil device.

Figure 14:
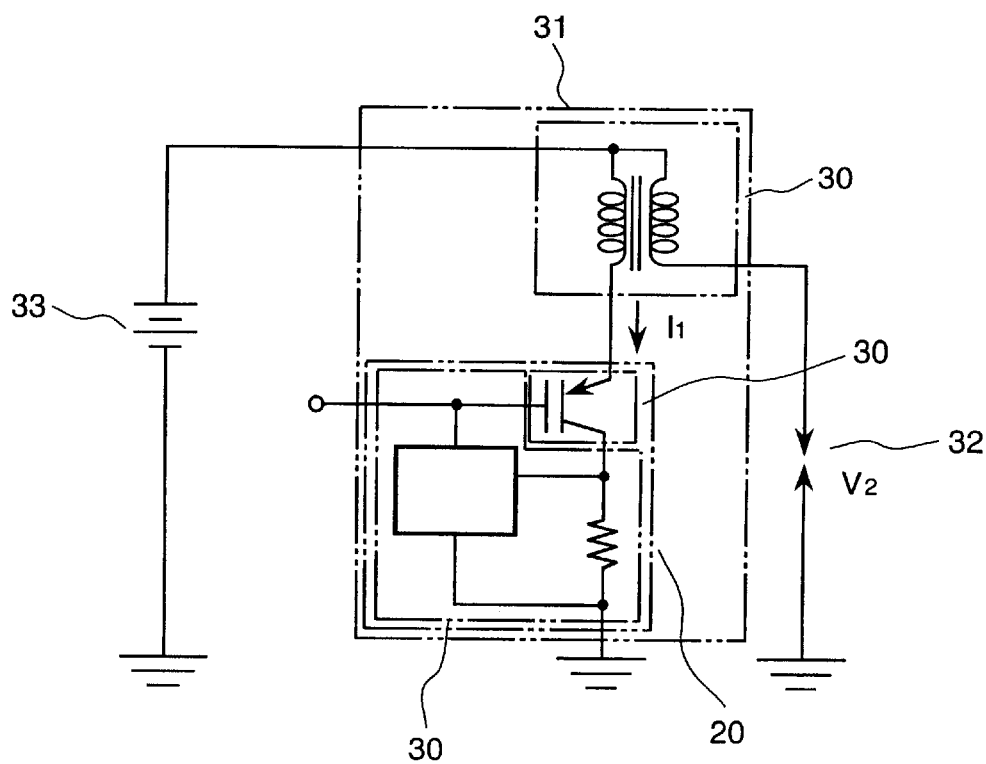

FIG. 14 is a diagram showing the circuit of the ignition coil device of FIG. 13.

Figure 15:
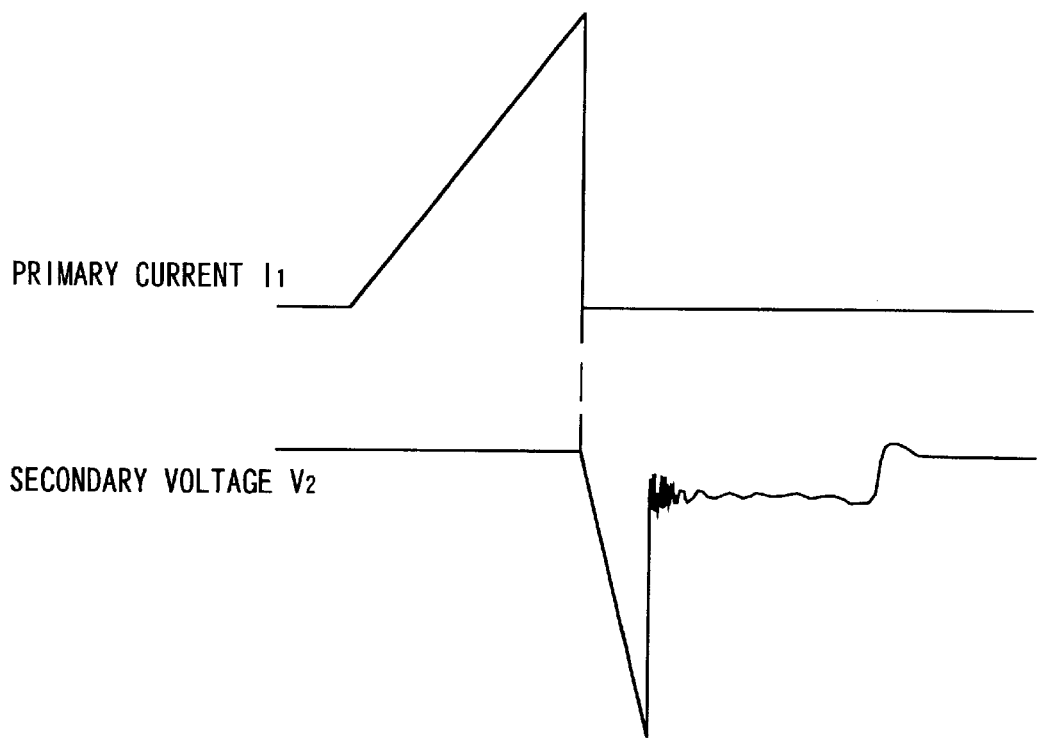

FIG. 15 is a chart showing the operation waveform.

Figure 16:
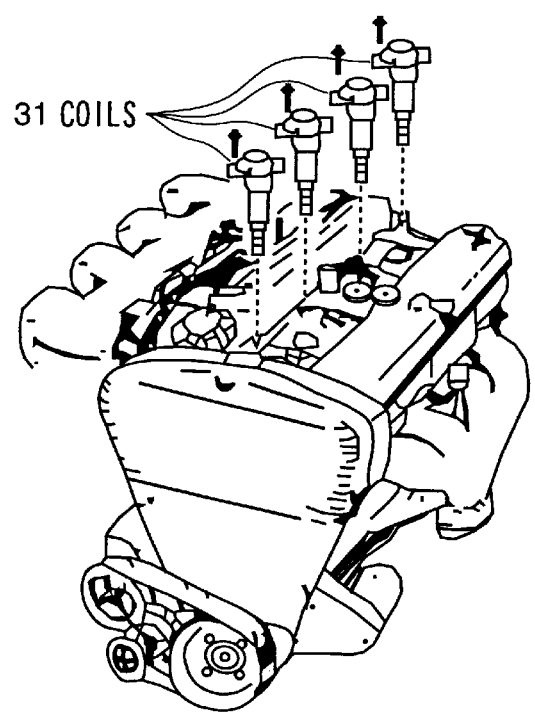

FIG. 16 is a view showing an example of a mounting application.

FIG. 17 is a chart showing an example of a strain analysis result.

DETAILED DESCRIPTION OF THE PREFERRED EMBODIMENTS

In FIG. 1, a flip chip type monolithic (hereinafter, referred to as "flip chip") IC 1 is mounted on a hybrid IC board or a glass-epoxy board 3, which has Conductor wires and resistors formed on a substrate of ceramic group, through solder golder bumps 2. The conductor wiring is not shown in this cross-sectional view.

A pad 7 for wire bonding is soldered on the hybrid circuit board 3 through solder 8, and connected to an external input/output terminal portion 5 with an aluminum wire 6. An electric function is constructed by supplying electric power to the circuit, and by inputting and outputting signals through the external input/output terminal portions 5, and by performing desired processing of the signals using the hybrid circuit board 3 including the flip chip IC 1.

A resin sealed type electronic device is formed by transfer-molding the hybrid circuit board 3 and part of the external input and output terminals 5 with a transfer molding resin 4 containing a filler (not shown in the figure). In that case, in order to make the transfer molding resin 4 easily flow around into a gap secured by the bump portion 2 of the flip chip 1, the filler particles contained in the resin used are the particles having selected size, for example, the particles selected on the bases of size having the height of the bump portion minus 10 $\mu$m. Therefore, the whole flip chip 1 portion including the solder bumps 2 can be sealed with the resin having an equal linear expansion coefficient by securing the resin to flow around under the flip chip 1 and making the amount of the filler in the resin under the flip chip 1 equal to the amount of the filler at the other portion in the peripheral portion of the flip chip 1.

The reference character 4' in the figure indicates the transfer molding resin flowing around into the gap.

Taking an example of the size of the filler particles, the filler having particle size smaller than 90 $\mu$m is employed by sifting the filler particles through a sieve when the solder bump height is 100 $\mu$m. when the fluidity and the cost are taken into consideration, it is preferable that the filler having filler particle size smaller than 70 $\mu$m is employed. The solder bump height is usually 100 $\mu$m to 150 $\mu$m.

In the past, an under filler material of a resin of epoxy group containing a filler in a liquid state under room temperature has been applied on the solder bump portion under the flip chip IC in order to improve resistance against thermal cycle of the solder bump portion. However, such an under filler material is expensive and the price of an applying apparatus is also expensive because the applying apparatus should have a high accuracy in positioning.

According to the present embodiment, it is possible to construct a resin sealed type electronic device reducing the thermal stress exerting on the solder bump 2 portion and having the high reliability by stipulating the linear expansion coefficient of the molding resin used and the size of the filler particles without using the under filler described above and by applying the transfer molding commonly used in packaging of semiconductor products to the hybrid circuit including the flip chip type IC.

Further, the high temperature durability of the resin sealed electronic device can be secured by employing the solder of tin/lead group for the solder used. By employing the solder of tin/silver group for the solder, the lead-free resin sealed electronic device can be attained.

The reference characters of the parts in FIG. 2 are in accordance with those in FIG. 1 except for the external input and output terminal portions of 5a, 5b and 5c.

FIG. 3 is an enlarged detailed cross-sectional view showing the flip chip portion of the resin sealed electronic device.

The flip chip IC 1 is soldered onto a conductor wiring portion 9 on the hybrid circuit board 3 through the solder bumps 2. The surface of the conductor wiring portion 9 other than a portion to be soldered is protected with coating glass 10 or the like. The solder bump 2 portion under the flip chip IC 1 is filled with the transfer molding resin 4 containing a molten filler 11 composed of cubic particles, spherical particles or a mixture of them which has been injected under a transfer molding pressure.

Since the thickness of the resin around the flip chip 1 is largely different from the thickness of the resin under the bump 2 portion, the void sometimes remains under the flip chip IC 1 as seen in FIG. 4.

The transfer molding resin 4 covers the whole flip chip IC in the initial stage of molding because the thickness in the periphery of the flip chip IC 1, and then enters under the solder bump 2 portion of the flip chip IC. Therefore, the air remaining under the flip chip IC 1 becomes a void and remains near the central portion under the flip chip IC. When the flip chip is small, the size of the remaining void is near the value that the air under the flip chip IC is compressed with the molding pressure.

When the chip size is large, the size of the remaining void becomes larger than the value that the air under the flip chip IC is compressed with the molding pressure because the resistance of the resin entering under the flip chip IC is increased. For example, when the chip size is smaller than 5 mm×5 mm, the size of the produced void is smaller than $\phi$0.5 mm. When the produced void is such a size, the thermal stress under the flip chip IC produced by the void is negligible even if there exists the void.

The reference character 1 in FIG. 2 indicates flip chip IC, and the reference character 2 indicates the solder bump, and the reference character 9 indicates the conductor wire on the hybrid circuit board.

Upon molding, the transfer molding resin covers the whole flip chip IC because the gap between the flip chip IC and the board of the bump portion is narrow, and then enters under the chip as shown by the arrows in the figure to produce the void 12. As described in FIG. 4, when the chip size is small, the stress effect due to the produced void is negligible.

FIG. 6 is a cross-sectional view corresponding to FIG. 1, and showing the construction of an embodiment of a resin sealed electronic device in which the external input and output terminals are directly soldered to the hybrid circuit board.

Each of the reference characters in the figure corresponds to each of the reference characters described above, and the filled state of the transfer resin is not shown but is similar to those in FIG. 3 and FIG. 4.

A flip chip type IC 1 in FIG. 7 is mounted on a hybrid IC board or a glass-epoxy board 3, which has conductor wires and resistors formed on a substrate of ceramic group, through solder bumps 2. The over coat of the conductor wires and the resistor on the hybrid circuit board is not shown in this cross-sectional view.

Discrete parts such as a capacitor 13 and so on are mounted on the hybrid circuit board 3 using solder 8. Further, a pad 7 for wire bonding is soldered through solder 8, and connected to an external output/input terminal 5 or a power system semiconductor element (a bipolar power transistor, an insulation gate type bipolar transistor or the like) 14 by an aluminum wire 6. The power system semiconductor element is mounted on a base portion 16 mounting the hybrid circuit board 3 through solder 15. The hybrid circuit board 3 is mounted on and fixed to the base portion 16 using an adhesive 17 of epoxy group or silicone group. An electric function is constructed by supplying electric power to the circuit and by inputting and outputting signals through the external input/output terminal portion 5, and performing desired processing of the signals using the hybrid circuit board 3 including the flip chip IC 1.

A resin sealed type electronic device is formed by transfer-molding the hybrid circuit board 3, the overall surface or one side surface in the side of mounting the hybrid circuit board 3 of the base portion 16 mounting the power system semiconductor element and part of the external input and output terminals 5 with a transfer molding resin 4 containing a filler (not shown in the figure).

In that case, as described in FIG. 1, in order to make the transfer molding resin 4 easily flow around into a gap secured by the bump portion 2 of the flip chip 1, the filler particles contained in the resin used are the particles selected on the bases of size having the height of the bump portion minus 10 $\mu$m. Therefore, the whole flip chip 1 portion including the solder bumps 2 can be sealed with the resin having an equal linear expansion coefficient by securing the resin to flow around under the flip chip 1 and making the amount of the filler in the resin under the flip chip 1 equal to the amount of the filler at the other portion in the peripheral portion of the flip chip 1.

It is possible to construct a complex power system resin sealed type electronic device reducing the thermal stress exerting on the solder bump 2 portion and having the high reliability by stipulating the linear expansion coefficient of the molding resin used and the size of the filler particles without using the under filler described above and by applying the transfer molding commonly used in packaging of semiconductor products to the hybrid circuit including the flip chip type IC and the power system semiconductor element.

The reference characters of the parts shown in FIG. 8 are in accordance with those in FIG. 1 except for the external input and output terminal portions of 5a, 5b, 5c and 5d. The external output terminal 5d is integrated with the base portion 16 and serves as a collector output terminal of the power system semiconductor element.

As shown in FIGS. 9 and 10, a coating material 19 of polyimide group or polyamide group is applied onto the surface except for solder bump 2 portions of the flip chip IC 1 in the circuit portion of the chip (the circuit pattern and so on are not illustrated in the figure). By doing so, the bonding property between the circuit surface of the flip chip IC 1 and the transfer molding resin can be improved. Therefore, by employing the present structure, the thermal stress exerting on the solder bump portions is further reduced and accordingly the reliability can be improved.

FIG. 11 is a chart showing the effect that in the resin sealed type electronic device using only the transfer molding resin without using the under filler material, the strain caused in the solder bumps is reduced compared to the conventional electronic device. Since the solder bumps are directly restricted by the integrated transfer molding resin, control of the thermal expansion state is uniquely performed and accordingly the strain caused in the solder bumps is decreased by the amount.

The size of the void produced under the flip chip IC increases as the length of side of the flip chip is increased. However, particularly, when the length of side of the flip chip exceeds 5 mm, the void size is rapidly increased because the resistance of the resin entering under the flip chip IC is increased and accordingly the air under the flip chip IC can not be compressed enough within the mold holding time. As the void size is increased, the resin produces a bending stress in the chip when temperature is varied. The bending stress is in a negligible level when the void size is smaller than 1 mm, but the bending stress becomes not negligible when the void size is larger than that value.

Therefore, the present invention is effective when the chip size of the flip chip is smaller than 5 mm×5 mm. However, the value of the void size under the chip is varied depending on the required durability.

As described above, it is possible to provide the method of packaging a hybrid circuit board mounting a flip chip IC capable of securing the high reliability by stipulating the linear expansion coefficient of the transfer molding resin and the size of the filler particles contained in the resin without using the under filler.

In that case, by setting the chip size below 5 mm×5 mm, the effect of the thermal stress due to the void produced under the chip can be suppressed to a negligible level and the reliability can be further improved.

By applying a coating material of polyimide or polyamide group onto the portion other than the solder bump configuration portions of the circuit surface on which the solder bumps of the flip chip are formed, the bonding property between the circuit surface of the flip chip and the transfer molding resin can be improved, and accordingly the reliability can be further improved.

A highly reliable complex type power system resin sealed electronic device can be easily obtained by mounting the hybrid circuit board mounting a flip chip IC and a power system semiconductor element on the lead frame and by transfer-molding them using the resin stipulated by the present invention after wiring through wire bonding.

By using a ceramic of the alumina group for the hybrid circuit board, by employing a conductor of the silver/platinum group or copper group for the conductor wiring on the board, and employing a high temperature solder of the tin/lead group for the solder used for the solder bumps of the flip chip IC and for mounting the discrete parts, a high temperature durable resin sealed type electronic device mounting a hybrid circuit board can be achieved. Further, by using a solder of the tin/silver group, a lead-free resin sealed type electronic device mounting a hybrid circuit board can also be achieved.

By using a high heat resistance glass-epoxy substrate for the hybrid circuit board and by employing the high temperature solder of the/silver group for the solder used for the solder bumps of the flip chip IC and for mounting the discrete parts, a lead-free and low-cost resin sealed type electronic device mounting a hybrid circuit board can be achieved.

In the case where the solder of the tin/silver group is used as the solder used for the solder bumps of the flip chip IC and for mounting the discrete parts, by setting the content of silver in the solder of silver/tin group to 1 to 5%, wettability equivalent to the solder of tin/lead eutectic group can be secured, and the reliability can be secured even being lead-free.

By assembling the hybrid circuit board using the solder of the tin/silver group and by using the solder of the tin/antimony group for mounting the power system semiconductor element, a lead-free complex power system resin sealed type electronic device can be achieved.

By using a resin of epoxy group commonly used in semiconductor packaging for the transfer molding, it is possible to use an economical resin. By using octo-cresol novolak type epoxy resin as the epoxy, and by setting the glass transition point temperature of the epoxy resin at a temperature higher than 150° C., the reliability of the contained the flip chip and the power system semiconductor element, if contained, can be secured up to the junction temperature of 150° C., that is, the general guaranteed operation temperature because the linear expansion coefficient of the resin dose not largely vary.

By using molten silica particles having a cubic shape, a spherical shape or a mixture of them as the filler added to the resin, the semiconductor parts, the discrete parts and the board can be prevented from being damaged or engaged by sharp edges in corners of the particles.

By adding silicone oil to the epoxy resin, slip occurs inside the resin to disperse stress, and accordingly the stress can be reduced.

A low-cost and highly reliable ignition coil containing a complex resin sealed type electronic device can be fabricated by constructing a circuit for performing conducting and breaking of primary current of an ignition coil for an internal combustion engine on the hybrid circuit board including flip chip IC of the complex resin sealed type electronic device, by using a bipolar transistor or an insulated gate type bipolar transistor for the power element, and by embedding the resin sealed complex power system semiconductor device into the ignition coil for internal combustion engine.

Description will be made below on an example of an ignition coil to which the present invention is applied.

FIG. 13 shows an embodiment of an ignition coil for a vehicle in which the resin sealed type electronic device is contained. The figure of the present embodiment shows a cylindrical coil containing the resin sealed type electronic device of the present invention in which the circuit construction is formed into an igniter circuit for ignition.

A primary portion and a secondary coil portion 30 (details are omitted) and the resin sealed type electronic device 20 in accordance with the present invention are contained inside a case 23 of the cylindrical coil 31, and embedded with injection type epoxy resin 24. Signal input to the coil and electric power input are performed through terminals 22 of a connector portion 21. Secondary voltage generated by the coil is supplied to a spark plug (not shown) through a spring 28 attached to a high voltage terminal 27. A boot portion 29 is engaged with the spark plug to provide watertightness. A plug hole seal 26 is engaged with a plug hole portion at attaching to the engine to provide watertiqhtness. A bush portion 25 attached to the coil case is provided for fixing the cylindrical coil to the engine with bolts or the like.

In the case where the resin sealed type electronic device is embedded in the coil with epoxy resin as described above, it is also necessary to pay attention to the stress produced by a linear expansion difference. However, in the case where the under filler material is applied onto the solder bump portion of the flip chip IC and then molded, as described in the conventional technology, when the materials are different and the linear expansion coefficients are different, stress is produced in the interface to reduce the reliability even if the bonding force in the interface is improved. According to the present invention, since the resin sealed type electronic device is directly molded with the injection type epoxy resin 24, it is possible to eliminate the potential of occurrence of trouble in regard to stress produced at that point.

Therefore, by doing so, it is possible to provide an internal combustion engine ignition coil device comprising a resin sealed electronic device which mounts a flip chip type monolithic IC on a hybrid circuit board through bumps, and is packaged with a transfer molding resin, wherein the resin sealed electronic device comprises a flip chip type monolithic IC having a size smaller than 5 mm×5 mm; a molding body integrated in a unit including the hybrid circuit board mounting the flip chip type monolithic IC through transfer molding with the transfer molding resin; and a structure that the molding body is embedded into the coil main body with a molding resin having a thermal expansion coefficient larger than a thermal expansion coefficient of the transfer molding resin, and a transfer molding resin portion composing said molding body shows a continuous uniform stress diagram including the transfer molding resin portion between the flip chip type monolithic IC and the hybrid circuit board.

Electric power is supplied from a power supply 33 in the circut of FIG. 14 to the coil 31 containing the resin sealed type electronic device having the circuit construction of the igniter. A hybrid circuit portion 30 mounting a flip chip IC and a power element portion 30 (an insulation gate type bipolar transistor, in this case) are contained inside the resin sealed type electronic device 20 having the circuit construction of the igniter. The primary current of the coil 30 is conducted and broken by processing signals from an engine control unit (not shown) using the hybrid circuit board 30 and then driving the power element 30. At that time, a high voltage is generated in the secondary side of the coil 30 and supplied to the spar plug 32.

As shown in FIG. 15, a secondary voltage V2 is generated in the secondary side of the coil when the primary current I1 is broken. Although it is not illustrated in the figure, the primary current is broken generally in 6 to 8 A and at that time the generated secondary voltage becomes 20 to 30 kV.

Since the coil 31 in the present embodiment is a cylindrical coil, the coils 31 are inserted into and attached to the plug holes of the engine as seen in FIG. 16. In the case where the present embodiment of the resin sealed type electronic device is contained into the coil 31 as described above, it is particularly necessary to take the thermal stress into consideration because the coil is directly attached to the engine.

FIG. 17 shows an example of analyzing strain produced in the solder bumps.

As having been described above, according to the present invention, since the resin sealed type electronic device is transfer-molded with the transfer molding resin in a unit including the hybrid circuit board mounting the flip chip IC, the structure formed through the transfer molding becomes a unit and the effect of thermal stress can be decreased because there is no need to use the conventionally used under filler material, the stress exerting on the solder bump can be reduced, and the fabricating process is simplified.

Further, by the construction described above, the resin sealed type electronic device can be reduced in size by reducing the chip size to the size below 5 mm×5 mm and the distance (gap) between the flip chip IC and the hybrid circuit board to the value below 10 $\mu$m, and at the same time it can be avoided to produce the void which is apt to be produced under the chip, the effect of thermal stress due to the void can be suppressed to a negligible level even if the void is produced, and further the reliability can be secured.

Furthermore, the small sized ignition coil device for an internal combustion engine can be provided by incorporating the resin sealed type electronic device of such size inside.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A resin sealed electronic device which mounts a flip chip type monolithic IC on a hybrid circuit board through bumps, and is packaged with a thermosetting resin through transfer molding, wherein said thermosetting resin used for the transfer molding (hereinafter, referred to as "transfer molding resin") has a linear expansion coefficient of $3 \times 10^{-6}$ to $17 \times 10^{-6}$ and contains a filler having a particle size smaller than a height of the bump by more than 10 $\mu$m, and said resin sealed electronic device is integrated in a unit including the hybrid circuit board mounting the flip chip type monolithic IC through transfer molding with said transfer molding resin.

2. A resin sealed electronic device according to claim 1, wherein size of said filler is smaller than 75 μm.

3. A resin sealed electronic device according to any one of claim 1, wherein said bump is soldered to a conductor wire on the hybrid circuit board, and surfaces of said bump except for a surface to be soldered are coated, and said transfer molding resin is thermally set on said coated surfaces.

4. A resin sealed electronic device according to any one of claim 1, wherein said transfer molding resin uses an epoxy resin.

5. A resin sealed electronic device according to any one of claim 1, wherein said hybrid circuit board is mounted on a lead frame of copper group; a power system semiconductor element being mounted at a position on said lead frame other than the board mounting portion using a solder or an electric conductive adhesive;

a bonding pad portion provided on said circuit board being connected to a bonding pad portion of the semiconductor element by wire bonding; and an external output terminal portion formed in said lead frame being connected to said circuit board similarly by wire bonding.

6. A resin sealed electronic device according to any one of claim 1, wherein a ceramic substrate of alumina group having a conductor of silver/platinum group or a conductor of copper group is used for said hybrid circuit board; and a high temperature solder of lead/tin group is used for the solder in the bump portion of the flip chip and the solder used for mounting discrete parts mounted on the board.

7. A resin sealed electronic device according to any one of claim 1, wherein a ceramic substrate of alumina group having a conductor of silver/platinum group or a conductor of copper group is used for said hybrid circuit board; and a high temperature solder of silver/tin group is used for the solder in the bump portion of the flip chip and similarly the solder used for mounting discrete parts mounted on the board.

8. A resin sealed electronic device according to any one of claim 1, wherein a high heat resistance glass-epoxy substrate having a linear expansion coefficient smaller than $17 \times 10^{-6}$ is used for the hybrid circuit board, and a high temperature solder of silver/tin group is used for the solder in the bump portion of the flip chip and similarly the solder used for mounting discrete parts mounted on the board.

9. A resin sealed electronic device according to any one of claim 7, wherein said solder of silver/tin group used contains silver of 1 to 5%.

10. A resin sealed electronic device which mounts a flip chip type monolithic IC on a hybrid circuit board through bumps, and is packaged with a transfer molding resin, wherein said resin sealed electronic device is integrated in a unit including the hybrid circuit board mounting the flip chip type monolithic IC through transfer molding with said transfer molding resin, and said bump is restrained from moving by the transfer molding resin flowing around at transfer-molding.

11. A resin sealed electronic device which mounts a flip chip type monolithic IC on a hybrid circuit board through bumps, and is packaged with a transfer molding resin, wherein said resin sealed electronic device is integrated in a unit including the hybrid circuit board mounting the flip chip type monolithic IC through transfer molding with said transfer molding resin, and a gap between said flip chip type monolithic IC and said hybrid circuit board is filled with said transfer molding resin flown around at transfer molding excluding voids or including voids.

12. A method of fabricating a resin sealed electronic device which mounts a flip chip type monolithic IC on a hybrid circuit board through bumps, and is packaged with a transfer molding resin, the method comprising the steps of:

performing molding using said transfer molding resin having a linear expansion coefficient of $3 \times 10^{-6}$ to $1 \times 10^{-6}$ and containing a filler having a particle size smaller than a height of the bump by more than 10 μm; and exerting a transfer molding pressure at said molding so that said transfer molding resin is let flow around between said flip chip type monolithic IC and said hybrid circuit board.

13. A method of fabricating a resin sealed electronic device according to claim 12, wherein said transfer molding resin uses an epoxy resin and said epoxy resin is octo-cresol novolak type epoxy resin, and a glass transition point temperature of said epoxy resin is higher than 150° C.

14. A method of fabricating a resin sealed electronic device according to claim 13, wherein said epoxy resin contains silicone of 1 to 8%.

15. A method of fabricating a resin sealed electronic device according to claim 12, wherein said filler is composed of cubicle molten silica particles, spherical molten silica particles or a mixture of the molten silica particles.

16. An internal combustion engine ignition coil device comprising a resin sealed electronic device which mounts a flip chip type monolithic IC on a hybrid circuit board through bumps, and is packaged with a transfer molding resin, wherein said resin sealed electronic device comprises a flip chip type monolithic IC having a size smaller than 5 mm×5 mm;

a molding body integrated in a unit including the hybrid circuit board mounting the flip chip type monolithic IC through transfer molding with the transfer molding resin; and a structure that said molding body is embedded into the coil main body with a molding resin having a thermal expansion coefficient larger than a thermal expansion coefficient of said transfer molding resin, and a transfer molding resin portion composing said molding body shows a continuous uniform stress diagram including the transfer molding resin portion between the flip chip type monolithic IC and the hybrid circuit board.

* * * * *